United States Patent
Bernard

(10) Patent No.: US 11,746,005 B2
(45) Date of Patent: Sep. 5, 2023

(54) DEEP REACTIVE ION ETCHING PROCESS FOR FLUID EJECTION HEADS

(71) Applicant: FUNAI ELECTRIC CO., LTD., Osaka (JP)

(72) Inventor: David L. Bernard, Lexington, KY (US)

(73) Assignee: FUNAI ELECTRIC CO. LTD

( * ) Notice: Subject to any disclaimer, the term of this patent is extended or adjusted under 35 U.S.C. 154(b) by 259 days.

(21) Appl. No.: 17/192,294

(22) Filed: Mar. 4, 2021

(65) Prior Publication Data

US 2022/0281740 A1 Sep. 8, 2022

(51) Int. Cl.
| | | |
|---|---|---|
| *B81C 1/00* | (2006.01) | |
| *B41J 2/14* | (2006.01) | |
| *B41J 2/16* | (2006.01) | |
| *B81B 1/00* | (2006.01) | |

(52) U.S. Cl.
CPC ............. *B81C 1/00087* (2013.01); *B41J 2/14* (2013.01); *B41J 2/162* (2013.01); *B41J 2/1629* (2013.01); *B81B 1/002* (2013.01); *B81B 2201/052* (2013.01); *B81B 2203/0353* (2013.01); *B81C 2201/0132* (2013.01)

(58) Field of Classification Search
CPC .......... B81C 1/00087; B81C 2201/0132; B41J 2/14; B41J 2/162; B41J 2/1629; B41J 2/1603; B41J 2/1628; B41J 2/1631; B41J 2/14129; B41J 2/1642; B81B 1/002; B81B 2201/052; B81B 2203/0353
See application file for complete search history.

(56) References Cited

U.S. PATENT DOCUMENTS

| | | |
|---|---|---|
| 6,336,714 B1 | 1/2002 | Kawamura et al. |
| 6,517,735 B2 | 2/2003 | Trueba et al. |
| 6,582,063 B1 | 6/2003 | Chavarria et al. |
| 7,018,015 B2 | 3/2006 | Truninger et al. |
| 8,444,255 B2 | 5/2013 | Bakker et al. |
| 2003/0098900 A1 | 5/2003 | Tokunaga |
| 2004/0155943 A1 | 8/2004 | Kim et al. |
| 2006/0103693 A1 | 5/2006 | Min et al. |
| 2019/0001675 A1 | 1/2019 | Kato et al. |
| 2019/0240980 A1 | 8/2019 | Schina et al. |

FOREIGN PATENT DOCUMENTS

| | | |
|---|---|---|
| JP | h1095119 A | 4/1998 |
| JP | 2015140010 A | 8/2015 |

OTHER PUBLICATIONS

IP.com search (Year: 2022).*
EP 1 314 563 A2, Tokunaga, Hiroyuki, Ink-Jet Head, and Method of Manufacturing the Same, May 28, 2003, Paragraphs 0071-0079, 0086 (Year: 2003).*

* cited by examiner

*Primary Examiner* — Lisa Solomon
(74) *Attorney, Agent, or Firm* — Luedeka Neely Group, PC

(57) ABSTRACT

An ejection head chip and method for a fluid ejection device and a method for reducing a silicon shelf width between a fluid supply via and a fluid ejector stack. The ejection head chip includes a silicon substrate and a fluid ejector stack deposited on the silicon substrate, wherein at least one metal layer of the fluid ejector stack is isolated from a fluid supply via etched in the ejection head chip by an encapsulating material.

17 Claims, 3 Drawing Sheets

DEEP REACTIVE ION ETCHING PROCESS FOR FLUID EJECTION HEADS

TECHNICAL FIELD

The disclosure is directed to micro-electro-mechanical (MEMS) devices and in particular to an improved fluid jet ejection head and method for fabricating the fluid jet ejection head.

BACKGROUND AND SUMMARY

Fluid jet ejection heads are used in a wide variety of application including, but not limited to, ink jet ejection heads, digital fluid dispensing devices, and pharmaceutical jet spray devices. A primary component of the fluid jet ejection device is a MEMS device that is made silicon substrate having metal and non-metal layers deposited thereon. A plurality of ejection head chips 10 are formed on silicon wafer 12 using a variety of deposition and etching processes. Once, fully formed, a nozzle plate is attached to the ejection head chips 10, and the ejection head chips are excised from the silicon wafer 12 and attached to a fluid cartridge.

Each fluid jet ejection head chip 10 includes a fluid supply via 14 therein for feeding fluid to a fluid chamber 16 containing a fluid ejector 18, such as a heater resistor, for expelling fluid through a nozzle hole 20 in a nozzle plate attached to the ejection head chip 10 (FIGS. 2-3). A cross-sectional view of a prior art fluid ejector stack for the ejection head chip 10 viewed through the fluid supply via 14 in a y direction is illustrated in FIGS. 4 and 5. A first layer 22 adjacent to the silicon substrate 24 is a field oxide layer. Layer 26 is an insulating layer that may be a doped glass layer such as a phosphorus-doped silicon glass layer. The field oxide layer 22 and insulating layer 26 have a combined thickness ranging from about 8,000 to about 30,000 Angstroms. Layer 28 is a passivation layer such as a composite silicon nitride/silicon carbide layer with silicon carbide being the top layer. The passivation layer 28 has a thickness ranging from about 1,000 to about 8,000 Angstroms. Layer 30 is metal layer such as tantalum which is used as a cavitation layer on a heater resistor for the ejection head 10. Layer 30 has a thickness ranging from about 1,500 to about 8,000 Angstroms. Layer 32 is a dielectric layer such as a doped or undoped diamond-like-carbon (DLC) layer. The dielectric layer 32 has a thickness ranging from about 2,000 to about 6,000 Angstroms. A planarization layer 34 is provided of spin-on-glass to provide a planar surface for attaching the nozzle plate to the fluid ejector stack 36 of the ejection head chip 10. The planarization layer 34 has a thickness ranging from about 1 to about 10 microns. The nozzle plate contains the nozzle holes 20 and may contain the fluid chamber 16 and a fluid channel 38 leading from the fluid supply via 14 to the fluid chamber 16, or a separate flow feature layer containing the fluid supply channel 38 and fluid chamber 16 may be attached to the planarization layer 34.

In an attempt to protect the tantalum layer 30 from corrosion from the fluids ejected from the ejection head, the fluid supply via 14 is etched in the ejection head chip 10 from the fluid ejector stack 36 side of the silicon wafer 12 using an etching mask that provides a shelf 40 of exposed silicon substrate 24 in an x direction between an entrance to the fluid supply channels 38 and the fluid supply via 14. A width W1 of the entrance of the fluid supply via 14 is dependent on the ejection head chip 10 design. Accordingly, the mask will provide an etched entrance fluid supply width of W1 ranging from about 60 to about 500 microns. The shelf width W2 typically varies from about 3 to about 20 microns so a maximum entrance width W3 of the fluid supply via 14 is about 57 to about 520 microns. A distance D1 in the x direction between the tantalum layers 30 on opposite sides of the fluid supply via 14 ranges from about 60 to about 520 microns. Since the fluid supply vias 14 are etched in all of the ejection head chips 10 on the wafer 12 at the same time any slight variation in the application of layer 34, or alignment of an etching mask to the fluid ejector stack 36 is critical and could lead to exposing the tantalum layer 30 to corrosion from the fluids ejected by the ejection head as illustrated in FIG. 5. Accordingly, the shelf width W2 was found to be critical for assuring that the tantalum layer is not exposed subsequent to etching the fluid supply vias 14 in the ejection head chips 10.

Maintaining a suitable shelf width W2 is time-consuming and problematic in the production of ejection head chips. The shelf width W2 requirement has constrained the design of wider fluid supply slots 14 using DRIE etch techniques. Conventional wisdom has required the silicon shelf width W2 be sufficient to prevent the metal layers, such as the tantalum layer 30 from being exposed to fluids ejected by the ejection head. Historically, the shelf width W2 has varied between about 3 and about 20 microns. It has been difficult to provide a reproducible shelf width W2 due to a number of factors including, but not limited to, mask resolution and bias, alignment issues with the mask and the substrate, inability to maintain a stable thermal environment in the DRIE chamber which produces undercutting and over-etching of the silicon substrate, and post etch residue cleanup. Accordingly, the requirement for a silicon shelf 40 has resulted in time consuming expensive and highly detailed automated measurement processes that have increased production time and production costs. Over-etched shelves 40 have been known to propagate the length of the fluid supply via 14 resulting in reduced ejection head chip 10 strength when used with various solvent-based fluids. Thus, the difficulties in maintaining the integrity of the silicon shelf 40 have resulted in a reduced yield of usable ejection head chips 10 from a silicon wafer 12. What is needed therefore, is an ejection head chip design that reduces or eliminates the reliance on the silicon shelf 40 to protect the metal layers from corrosion due to contact with fluid ejected by the ejection head. There is also a need for wider fluid supply vias 14 for increased fluid flow to the fluid ejectors 18 without increasing the overall size of the ejection head chip 10.

In view of the foregoing an embodiment of the disclosure provides an ejection head chip for a fluid ejection device. The ejection head chip includes a silicon substrate and a fluid ejector stack deposited on the silicon substrate, wherein at least one metal layer of the fluid ejector stack is isolated from a fluid supply via etched in the ejection head chip by an encapsulating material.

In another embodiment, there is provided a method for reducing a silicon shelf width between a fluid supply via and a fluid ejector stack. The method includes the steps of (a) depositing at least one insulating layer on a silicon substrate, (b) depositing a silicon nitride layer on the at least one insulating layer, (c) depositing a metal layer on the silicon nitride layer, (d) encapsulating the metal layer in an encapsulating material, wherein the encapsulating material boarders two sides of the fluid supply via, (e) applying an etch mask to the fluid ejector stack to define a location for the fluid supply via, and (f) etching the fluid supply via in the silicon substrate with a minimum width ranging from about 60 to about 520 microns, to provide a silicon shelf having a width ranging from about 0 to about 20 microns.

In some embodiments, the at least one metal layer comprises tantalum.

In some embodiments, the fluid supply via is etched in the silicon substrate from a fluid ejector stack side of the substrate using a deep reactive ion etch (DRIE) process.

In some embodiments, the encapsulating material is selected from silicon oxide or silicon dioxide derived from a chemical vapor deposition of an organic silicon compound as a protective overcoat layer. In other embodiments, the encapsulating material further includes an inter-metal dielectric layer. In some embodiments, the inter-metal dielectric layer is a doped or undoped diamond-like-carbon material. In other embodiments the encapsulating material further includes a silicon nitride layer.

In some embodiments, the at least one metal layer is isolated from an edge of the fluid supply via by from about 1.5 to about 2.5 microns of encapsulating material.

An advantage of using the encapsulating material for protecting the metal layer in the fluid ejector stack is that the need for a silicon shelf between the fluid supply via and the fluid ejector stack is reduced thereby greatly simplifying wafer inspection. Edge roughness of the fluid supply vias may also be reduced due to improved protection of the fluid ejector stack. The fluid via width may be increased to provide increased fluid refill rates for the fluid chambers by reducing the width of the silicon shelves in the x direction adjacent to the fluid supply vias.

DETAILED DESCRIPTION

Figure 1:
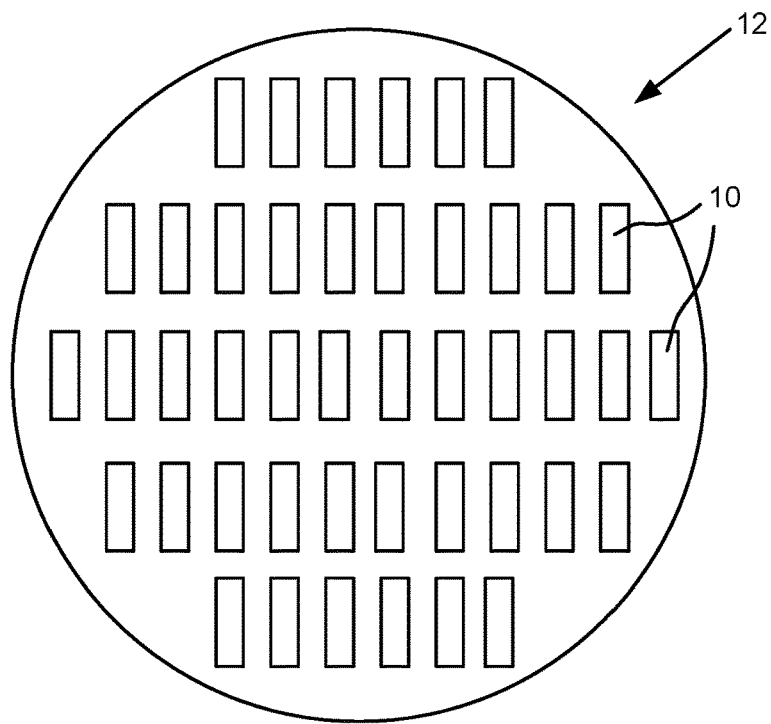
FIG. 1 is plan view, not to scale, of a prior art silicon wafer containing a plurality of ejection head chips for use in making fluid jet ejection heads.
Figure 2:
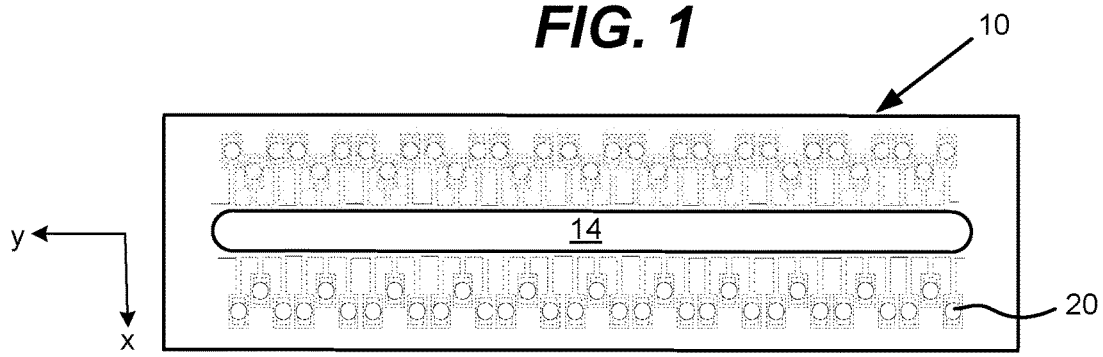
FIG. 2 is a plan view, not to scale, of a prior art ejection head chip made from the silicon wafer of FIG. 1.
Figure 3:
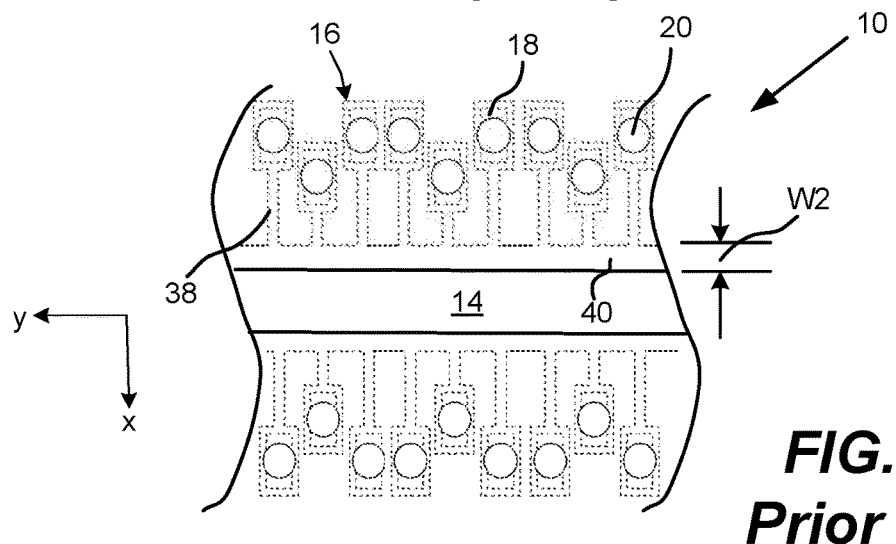
FIG. 3 is an enlarged plan view, not to scale, of a portion of the ejection head chip of FIG. 2.
Figure 4:
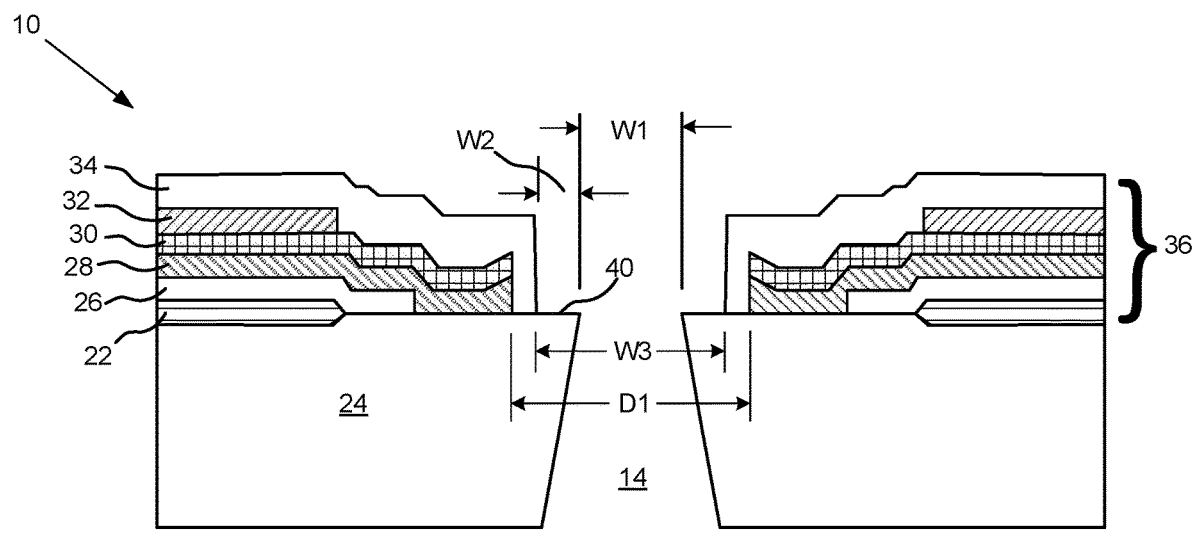
FIGS. 4-5 are cross-sectional views, not to scale, in a y direction through the ejection head chips of FIG. 2 made according to a prior art process.
Figure 5:
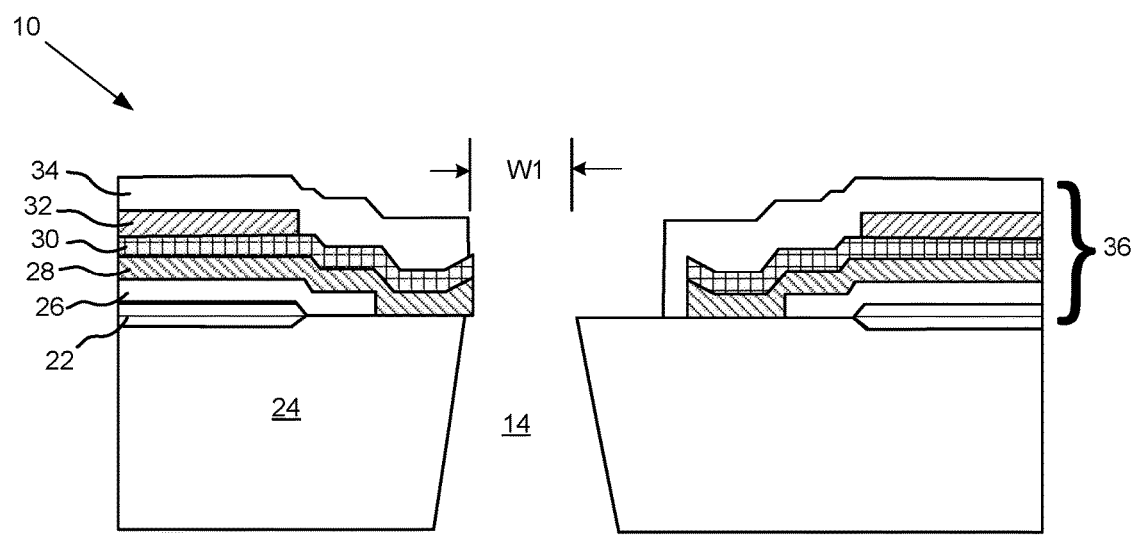

As shown in FIGS. 4-5, the maximum entrance width or the fluid supply via 14 for the prior art fluid ejector stack 36 ranges from about 60 (W1) to about 520 microns (W3). Such fluid supply width is maintained in order to prevent under-etching the fluid ejector stack 36 as shown in FIG. 5 and expose the metal layer 30 to corrosion from the fluid ejected by the ejection head.

Figure 6:
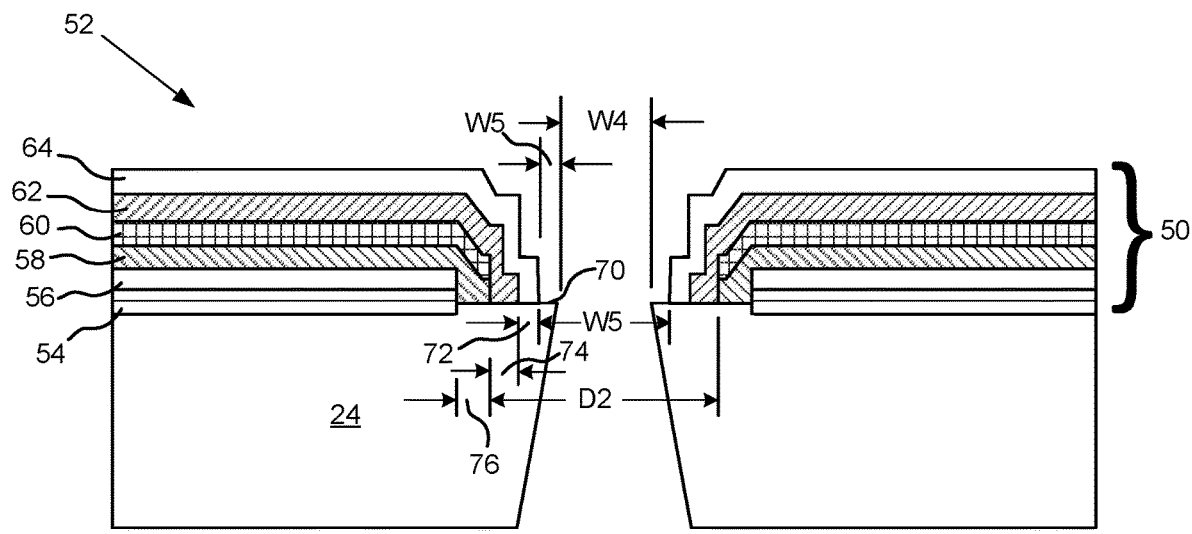
FIGS. 6-7 are cross-sectional views, not to scale, in a y direction through an ejection head chips made according to an embodiment of the disclosure.
Figure 7:
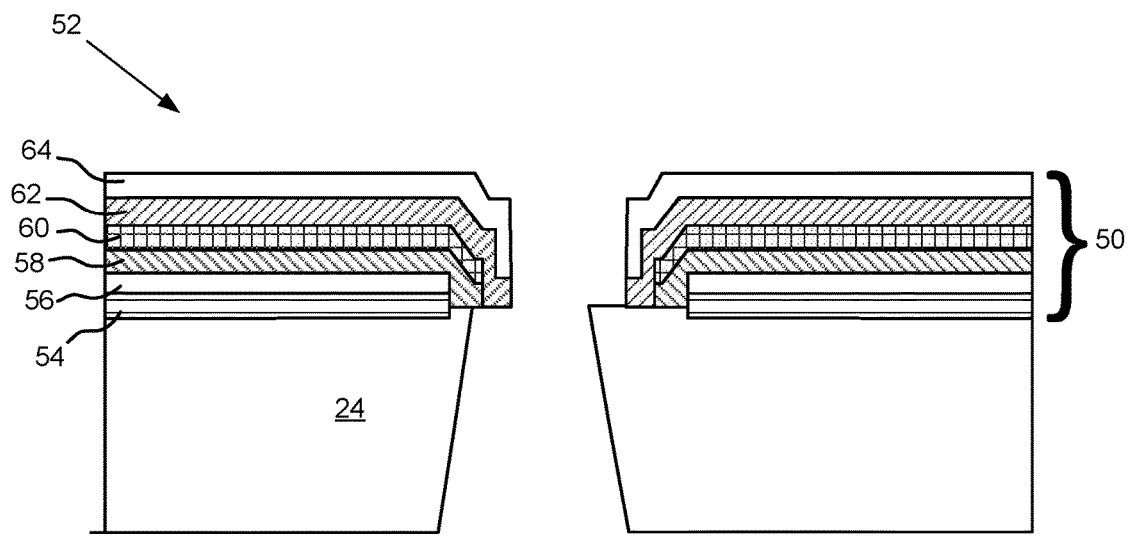

In order to better protect the metal layer 30 so that the reliance on the silicon shelf is reduced, an improved fluid ejector stack 50 for an ejection head chip 52 is provided in FIGS. 6-7. The fluid ejector stack 50 is shown in cross-sectional view in they direction through the fluid supply via 14.

Like the prior art ejection head chip 10, the ejection head chip 52 includes a first layer field oxide layer 54 adjacent to the silicon substrate 24. Next, an insulating layer 56 that may be a doped glass layer such as a phosphorus-doped silicon glass layer is deposited or grown on the field oxide layer 54. The field oxide layer 54 and insulating layer 56 have a combined thickness ranging from about 8,000 to about 30,000 Angstroms. A silicon nitride layer 58 is deposited on the insulating layer 56 as a passivation layer and underlies a portion of the metal layer 60 so that the underlying portion is between the silicon substrate 24 and the metal layer 60. The passivation layer 58 has a thickness ranging from about 1,000 to about 15,000 Angstroms. Layer 60 has a thickness ranging from about 1,500 to about 10,000 Angstroms. Next a dielectric layer 62 such as a doped or undoped diamond-like-carbon (DLC) layer is deposited on the metal layer 60 so that the metal layer 60 is totally encapsulated between the silicon nitride layer 58 and the dielectric layer 62. The dielectric layer 62 has a thickness ranging from about 2,000 to about 10,000 Angstroms. Finally, an encapsulating layer 64 that is selected from silicon oxide or silicon dioxide that is deposited on the dielectric layer 62 by a chemical vapor deposition process from an organic silicon compound. The encapsulating layer 64 has a thickness ranging from about 2,000 to about 10,000 Angstroms. The encapsulating layer 64 is also resistant to etching and acts as an etch mask during the DRIE process for forming the fluid supply vias 14. The encapsulating layer 64 may also provide a planar surface for attaching a nozzle plate or a flow feature layer containing the fluid supply channels 38 and fluid chambers 18 thereto.

As shown in FIGS. 6-7, the metal layer 60 is totally isolated from the fluid supply via 14 by the passivation layer 58 and the combination of the dielectric layer 62 and encapsulating layer 64. The encapsulating layer 64 may be selected from other materials that are resistant to the DRIE process for forming the fluid vias 14 in the ejection head chips 52. For purposes of this disclosure, the passivation layer 58, dielectric layer 62, and encapsulating layer 64 are collectively referred to as the "encapsulating material."

A positive photoresist mask may be deposited on the encapsulating layer 64 after the encapsulating layer 64 is imaged and developed to provide a location for the fluid supply via 14. Accordingly, the positive photoresist mask may be readily aligned with the opening in the encapsulating layer 64 without having to provide a silicon shelf adjacent to both edges of the fluid supply via 14. A shelf width W6 of a silicon shelf 70 may range from about 0 to about 20 microns.

As shown in FIG. 7, even if the encapsulating layer 64 and dielectric layer 62 are undercut during DRIE process for forming the fluid supply via 14 by misalignment of the etching mask, temperature variability in the etching, or other etching process variations, the metal layer 60 remains completely isolated from the fluid flowing through the fluid supply via 14 by the silicon nitride layer 58, dielectric layer 62 and encapsulating layer 64. All three layers 58, 62 and 64 are resistant to the DRIE process and thus remain intact surrounding the metal layer 60. Accordingly, the thickness 72 of the encapsulating layer 64 adjacent to the silicon substrate 24 may range from about 6,000 to about 12,000 Angstroms. The thickness 74 of the dielectric layer adjacent to the silicon substrate 24 may also range from about 6,000 to about 12,000 Angstroms. The thickness of the silicon nitride layer 58 adjacent to the silicon substrate 24 may range from about 10,000 to about 20,000 Angstroms.

As a benefit of the use of the revised fluid ejector stack 50, the reliance on the silicon shelf width W2 for corrosion protection has been eliminated. Accordingly, instead of a target shelf width of 10 to 20 microns, the shelf width target may be 8 microns or less. However, even with the reduced shelf width target, the amount of ejection head chips that are rejected is greatly reduced, even if there is silicon substrate undercutting in the x direction, because the metal layer is totally encapsulated in the encapsulating material. Accordingly, there is less need to include the shelf width in the calculations used to determine the width W4 of the entrance of the fluid supply via 14. Thus, DRIE mask placement may use the entire opening in the encapsulating layer to reduce process setup time. Wafer inspection after DRIE etching may be simplified thereby increasing product throughput.

As an added benefit, the encapsulating material may also reduce fluid supply via edge roughness due to mask failure during the DRIE process since the encapsulating material is etch resistant. Fluid supply via edge roughness, due to wafer temperature variability during the DRIE process has been known to reduce chip strength.

It will be appreciated that the use of a reduce shelf width W5 may also reduce ejection head chip costs by reducing the overall width of the ejection head chip. For the same overall width of the ejection head chip, a wider fluid supply via 14 may be used by reducing the shelf width W5 thereby increasing the fluid refill rate to the fluid chambers which will result in faster fluid ejection cycles for higher fluid dispensing speeds.

It is noted that, as used in this specification and the appended claims, the singular forms "a," "an," and "the," include plural referents unless expressly and unequivocally limited to one referent. As used herein, the term "include" and its grammatical variants are intended to be non-limiting, such that recitation of items in a list is not to the exclusion of other like items that can be substituted or added to the listed items.

While particular embodiments have been described, alternatives, modifications, variations, improvements, and substantial equivalents that are or can be presently unforeseen can arise to applicants or others skilled in the art. Accordingly, the appended claims as filed and as they can be amended are intended to embrace all such alternatives, modifications variations, improvements, and substantial equivalents.

What is claimed is:

1. An ejection head chip for a fluid ejection device comprising, a silicon substrate and a fluid ejector stack deposited on the silicon substrate, wherein at least one metal layer of the fluid ejector stack is isolated from a fluid supply via etched in the ejection head chip by an encapsulating material, wherein the encapsulating material comprises silicon oxide or silicon dioxide derived from a chemical vapor deposition of an organic silicon compound.

2. The ejection head chip of claim 1, wherein a silicon shelf width between the fluid supply via and the fluid ejector stack ranges from about 0 to about 20 microns.

3. The ejection head chip of claim 1, wherein the at least one metal layer comprises tantalum.

4. The ejection head chip of claim 1, wherein the fluid supply via is etched in the silicon substrate from a fluid ejector stack side of the substrate using a deep reactive ion etch (DRIE) process.

5. The ejection head chip of claim 1, wherein the fluid supply via has a minimum width ranging from about 60 to about 520 microns.

6. The ejection head chip of claim 1, wherein the encapsulating material further comprises an inter-metal dielectric layer.

7. The ejection head chip of claim 6, wherein the inter-metal dielectric layer comprises a doped or undoped diamond-like-carbon material.

8. The ejection head chip of claim 1, wherein the encapsulating material further comprises a silicon nitride layer.

9. The ejection head chip of claim 1, wherein the at least one metal layer is isolated from an edge of the fluid supply via by from about 1.5 to about 2.5 microns of encapsulating material.

10. A method for reducing a silicon shelf width between a fluid supply via and a fluid ejector stack comprising,
   depositing at least one insulating layer on a silicon substrate,
   depositing a silicon nitride layer on the at least one insulating layer,
   depositing a metal layer on the silicon nitride layer,
   encapsulating the metal layer in an encapsulating material, wherein the encapsulating material boarders two sides of the fluid supply via,
   applying an etch mask to the fluid ejector stack to define a location for the fluid supply via, and
   etching the fluid supply via in the silicon substrate with a minimum width ranging from about 60 to about 520 microns, to provide a silicon shelf having a width ranging from about 0 to about 20 microns.

11. The method of claim 10, wherein the metal layer comprises tantalum.

12. The method of claim 10, wherein the fluid supply via is etched in the silicon substrate from a fluid ejector stack side of the substrate using a deep reactive ion etch (DRIE) process.

13. The method of claim 10, wherein the encapsulating material comprises silicon oxide or silicon dioxide derived from a chemical vapor deposition of an organic silicon compound as a protective overcoat layer.

14. The method of claim 13, wherein the encapsulating material further comprises an inter-metal dielectric layer.

15. The method of claim 14, wherein the inter-metal dielectric layer comprises a doped or undoped diamond-like-carbon material.

16. The method of claim 13, wherein the encapsulating material further comprises a silicon nitride layer.

17. The method of claim 10, wherein the at least one metal layer is isolated from an edge of the fluid supply via by from about 1.5 to about 2.5 microns of encapsulating material.

\* \* \* \* \*